(12) United States Patent
Ida et al.

(10) Patent No.: US 6,553,659 B1
(45) Date of Patent: Apr. 29, 2003

(54) ELECTRONIC COMPONENT MOUNTING APPARATUS

(75) Inventors: Akiko Ida, Neyagawa (JP); Muneyoshi Fujiwara, Katano (JP); Kunio Sakurai, Toyonaka (JP); Minoru Yamamoto, Osaka (JP); Kurayasu Hamasaki, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 140 days.

(21) Appl. No.: 09/644,566

(22) Filed: Aug. 24, 2000

(30) Foreign Application Priority Data

Aug. 25, 1999 (JP) ............................................ 11-237975

(51) Int. Cl.⁷ ................................................ H05K 3/32
(52) U.S. Cl. ............................. 29/840; 29/740; 29/832; 29/834
(58) Field of Search ........................ 29/740, 741, 743, 29/832, 834, 836, 840; 294/2, 64.1; 414/737, 752; 901/40

(56) References Cited

U.S. PATENT DOCUMENTS

| | | | | |
|---|---|---|---|---|
| 5,850,683 A | * | 12/1998 | Okazaki | 29/740 |
| 6,012,222 A | * | 1/2000 | Asai | 29/832 |
| 6,195,878 B1 | * | 5/2001 | Hata | 29/243 |
| 6,240,628 B1 | * | 7/2001 | Yoshida | 29/740 |
| 6,276,051 B1 | * | 8/2001 | Asai | 29/740 |
| 6,298,547 B1 | * | 10/2001 | Okuda | 29/740 |
| 6,336,268 B1 | * | 1/2002 | Inutsuka | 29/833 |

FOREIGN PATENT DOCUMENTS

| | | |
|---|---|---|
| EP | 0724381 | 7/1996 |
| EP | 0749270 | 12/1996 |
| EP | 0941022 | 9/1999 |
| JP | 1-107600 | 4/1989 |
| WO | 98/34454 | 8/1998 |

OTHER PUBLICATIONS

Patent Abstracts of Japan vol. 013, No. 348, published Aug. 4, 1989.

* cited by examiner

*Primary Examiner*—Peter Vo
*Assistant Examiner*—Alan M. Boswell
(74) *Attorney, Agent, or Firm*—Greenblum & Bernstein, P.L.C.

(57) ABSTRACT

Each of a plurality of suction nozzle sections 20 provided about the outer circumference of an intermittently rotating head section 21 comprises a plurality of nozzle tip sections 10 for picking up electronic components 22 by suction, these nozzle tip sections 10 being connected to a rod section 4, which is driven to rotate by a motor 1. A cylindrical cam section 8 having a cam surface 8a and being able to rotate relative to the rod section 4 is provided such as to encase the nozzle tip sections 10, and one ends of the nozzle tip sections 10 engage with the cam surface 8a of the cam section 8 via rollers 6, whereby the nozzle tip sections 10 are movable in a vertical direction. On the outer side of the cylindrical cam section 8, a stopper section 12 is provided for halting temporarily the rotation of only the cylindrical cam surface 8.

6 Claims, 4 Drawing Sheets

ELECTRONIC COMPONENT MOUNTING APPARATUS

BACKGROUND OF THE INVENTION

1. Field of the Invention

The present invention relates to an electronic component mounting apparatus for mounting electronic components successively in prescribed positions on a mounting object, such as a circuit board, or the like.

2. Description of Related Art

FIG. 4 shows one example of an electronic component mounting apparatus of this kind. The apparatus comprises a component supplying section 16 for accommodating and automatically supplying electronic components 22, a component mounting section 18 moving in mutually orthogonal X and Y directions in order to register the position of a circuit board 17 onto which electronic components 22 are to be mounted, suction nozzle sections 120 for picking up electronic components 22 automatically supplied by the component supplying section 16 and mounting same at prescribed positions on the circuit board 17, and a head section 121 comprising a plurality of such suction nozzle sections 120 provided on the outer circumference thereof. The head section 121 is driven to rotate intermittently to prescribed halt positions, where the suction nozzle sections 120 perform the operations of picking up the electronic components 22 by suction and mounting same on the circuit board 17.

The details of the aforementioned suction nozzle sections 120 are described here with reference to FIG. 5.

The suction nozzle section 120 is supported on a guide 24 in a vertically slidable fashion and is thereby mounted on the electronic component mounting apparatus. A cam follower 30 is provided at a prescribed position in the guide section 24 in order to engage with a raising and lowering groove cam (not illustrated). On the inner portion of each suction nozzle section 120, a rotating member 31 is provided rotatably about a vertical axis with respect to the upper face of the circuit board 17 on which electronic components are to be mounted. Below the rotating member 31, there is provided a U-shaped rod section 32 which engages with the rotating member 31 via a coupling member (not illustrated) and rotates about the same vertical axis as the rotating member 31.

At the upper end of the rotating member 31, a coupling section 31a with V-shaped grooves that engages with rotational driving means (not illustrated) is provided. Below the U-shaped rod section 32, a rotating member 27 which rotates about a horizontal axis with respect to the upper face of the circuit board 17 is provided by means of a bearing (not illustrated), and a turret 25 is disposed in such a manner that it engages with this rotating member 27. A plurality of nozzle tip sections 26 are attached to this turret 25. Furthermore, engaging grooves 27a for restricting rotation are provided in the rotating member 27, along with a spring 29 which presses an engaging hook 28 capable of engaging with and disengaging from the engaging groove 27a, towards an engagement position.

This electronic component mounting apparatus is operated as described below.

The head section 121 comprising a plurality of suction nozzle sections 120 is rotated intermittently in the direction indicated by the arrow in FIG. 4. Firstly, at a component supply position of the component supplying section 16, a suction nozzle section 120 picks up an electronic component 22 by suction, whereupon the attitude of the suctioned electronic component 22 is recognized at a position corresponding to an image recognition section 19.

Depending on the attitude of the suctioned electronic component 22 thus recognized, an amount of correction for the positional registration position of the component mounting section 18, and an amount of correction for the rotation of the nozzle tip section (U-shaped rod section) 32 are calculated, in consideration of the mounting position and mounting angle for the electronic component 22 onto the circuit board 17 that are registered beforehand. The component mounting section 18 is moved and the nozzle tip section (U-shaped rod section) 32 is rotated on the basis of the calculated data (respective amounts of correction), whereupon the electronic component 22 is mounted onto the circuit board 17. In this operation, the engaging hook 28 is caused to perform a rocking movement about the fulcrum thereof, by means of a rocking movement of a lever (not illustrated) contacting one end thereof, thereby releasing the other end thereof which is engaged with an engaging groove 27a of the rotating member 27. Thereupon, the turret 25 coupled to the rotating member 27 is rotated by driving the rotating member 27 by the rotational driving means (not illustrated).

When a prescribed nozzle tip section 26 is selected, the lever (not illustrated) contacting one end of the engaging hook 28 is released by a rocking movement, whereby the engaging hook 28 is caused to engage with an engaging groove 27a of the rotating member 27 by means of the spring 29 pressing the engaging hook 28 towards the engagement position. Thereupon, at a position corresponding to a nozzle recognition section 23 in FIG. 4, image recognition of the nozzle tip section 26 is performed, and it is determined whether or not the prescribed nozzle has been selected. The series of operations described above is performed repeatedly.

However, in this conventional electronic component mounting apparatus, when selecting a nozzle tip section 26, it is necessary to halt the rotation of the head section 121 temporarily for a prescribed period of time, in order to release the engaging hook 28 from the engaging groove 27a of the rotating member 27 and rotate the rotating member 27 by the rotational driving means, and hence this is greatly disadvantageous when seeking to achieve a high-speed component mounting operation.

Moreover, since it is necessary to provide a spring 29 having a high elastic force to press on the engaging hook 28, the load on the engaging grooves 27a of the rotating member 27 and on the engaging hook 28 is high, and hence this has an adverse effect on durability.

SUMMARY OF THE INVENTION

Consequently, it is an object of the present invention to resolve the aforementioned problems by providing an electronic component mounting apparatus, whereby increased speed in electronic component mounting operations can be achieved by enabling nozzle tip sections to be selected whilst a head section is rotating, and furthermore, whereby the durability of suction nozzle sections can be improved.

In order to achieve the aforementioned object, the electronic component mounting apparatus of the present invention comprises an improved suction nozzle section that comprises a plurality of nozzle tip sections, a rod section for holding said nozzle tip sections such as to allow each of the nozzle tip sections to move upward and downward, said nozzle tip sections being disposed about the outer edge of the rod section, a motor section connected to the rod section for causing said rod section to rotate about the central axis of the suction nozzle section, a cylindrical cam section provided concentric with the rod section such as to be rotatable relative to the rod section, having a cam surface for restricting height positions of the nozzle tip sections by performing relative rotation with respect to the rod section, and a stopper section provided on an outer side of the cylindrical cam section for halting the rotation of the cylindrical cam section so as to cause only the rod section to rotate relative to the cylindrical cam section.

More specifically, the stopper section comprises a recess formed in a side face of the cylindrical cam section and an engaging section disposed engageably and disengageably with said recess. When the engaging section of the stopper section is engaged with the recess in the cylindrical cam section, only the rod section can rotate, so that, of the plurality of nozzle tip sections held by the rod section, the nozzle tip section guided by the cylindrical cam section such that it assumes a lowermost position is selected as the nozzle to be used. When the engaging section of the stopper section is not engaged with the recess in the cylindrical cam section, the cylindrical cam section rotates in conjunction with the rod section, in such a manner that the rotational position of the nozzle tip section can be corrected.

According to the present invention, by rotating the head section, electronic components are picked up from the component supplying section by suction nozzle sections, and subsequently, by further rotating the head section, the picked up electronic components are mounted at prescribed positions on a mounting object. During this operation, a nozzle tip section can be selected whilst the head section is rotating by driving the motor section, and hence no time for halting the head section is required as in the prior art, thereby making it possible to increase the speed of electronic component mounting processes. Moreover, by adopting a cylindrical cam section in each suction nozzle section, it is possible to reduce the load on the suction nozzle section in comparison to the force imparted by the spring in the prior art, and hence durability can be improved.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

One embodiment of the electronic component mounting apparatus according to the present invention is now described with reference to FIG. 1 to FIG. 3.

Figure 4:
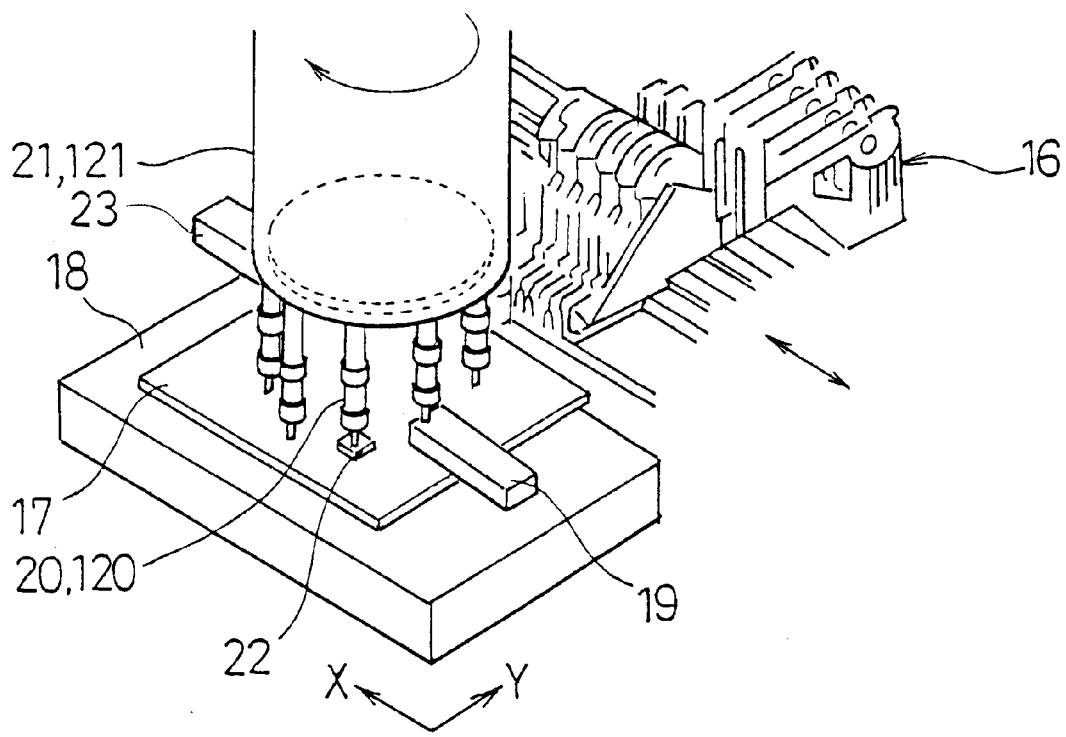
FIG. 4 is an oblique view showing the overall composition of an electronic component mounting apparatus.
Figure 5:
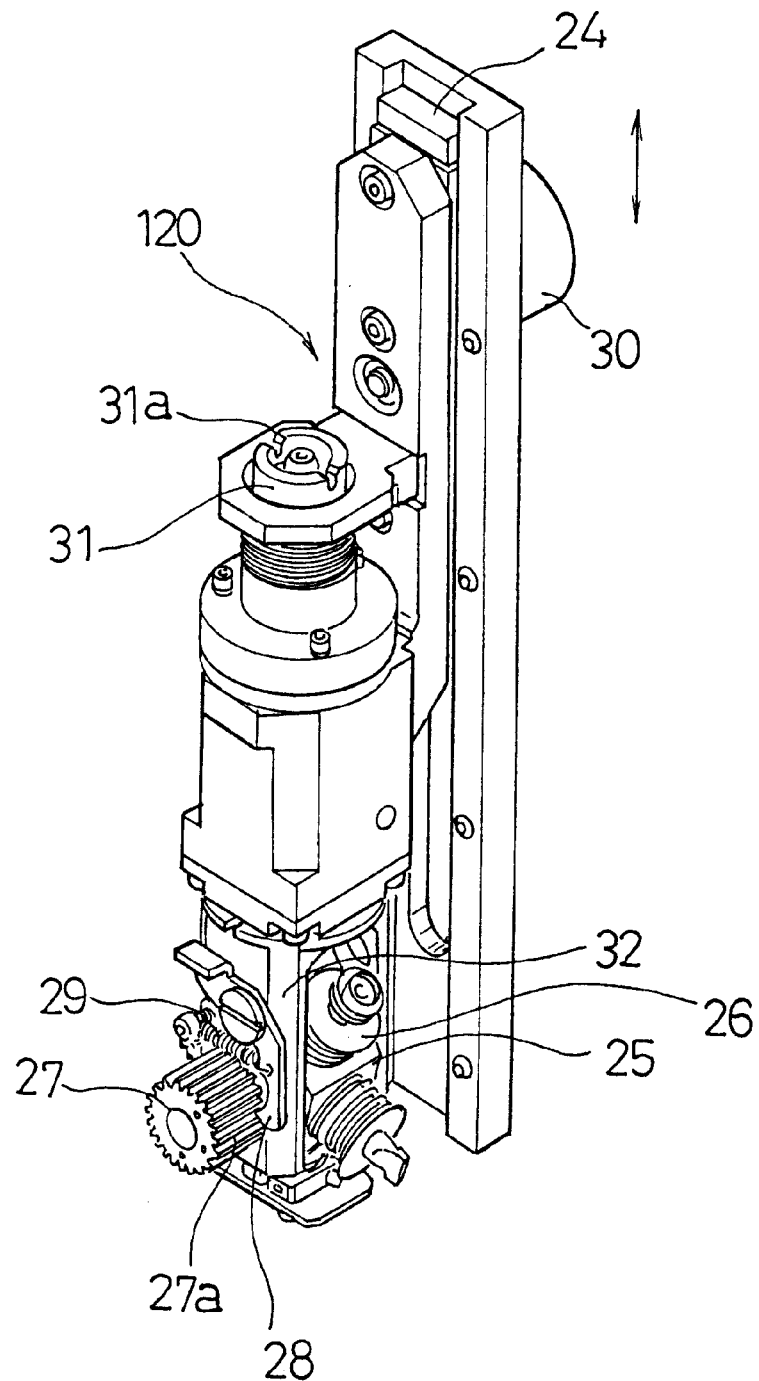
FIG. 5 is an oblique view showing a suction nozzle section according to the prior art.

The overall construction of the electronic component apparatus is substantially the same as that of the prior art described above with reference to FIG. 4, and it will be described below with the same reference numerals except for the head section 20 and the suction nozzle section 21, which are basically the novel features of the present invention. The apparatus in this embodiment comprises: a component supplying section 16 for supplying electronic components 22; a component mounting section 18 for mounting electronic components 22 on a circuit board 17 or the mounting object; suction nozzle sections 20 for picking up electronic components 22 by suction and mounting same on the circuit board 17; and a head section 21 supporting a plurality of such suction nozzle sections 20 on the outer circumference thereof. The head section 21 causes the suction nozzle sections 20 to move in a circular fashion, and furthermore, it is supported in such a manner that it can perform upward and downward movement in order to pick up electronic components 22 from the component supply section 16 and mount electronic components 22 at the component mounting section 18, whilst controlling the height of the suction nozzle sections 20 to a required height according to their position. Moreover, the head section 21 is rotated intermittently and performs tasks at respective halt positions, namely, picking up of electronic components 22 by suction in the aforementioned manner and mounting of same onto the circuit board 17, in a simultaneous fashion.

Figure 1:
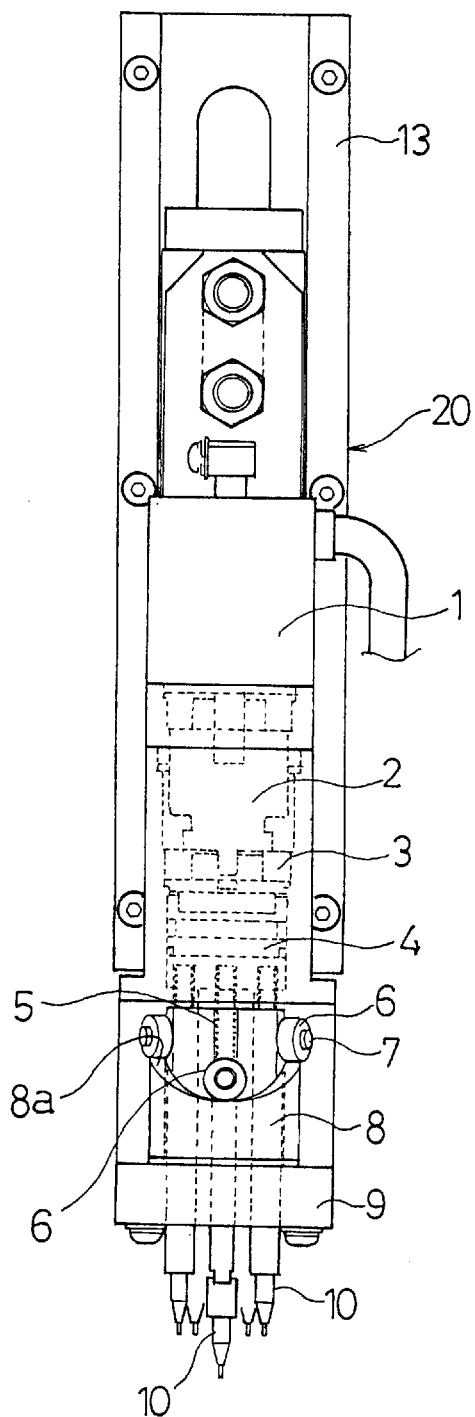
FIG. 1 is a front view of a suction nozzle section according to an embodiment of the present invention.
Figure 2:
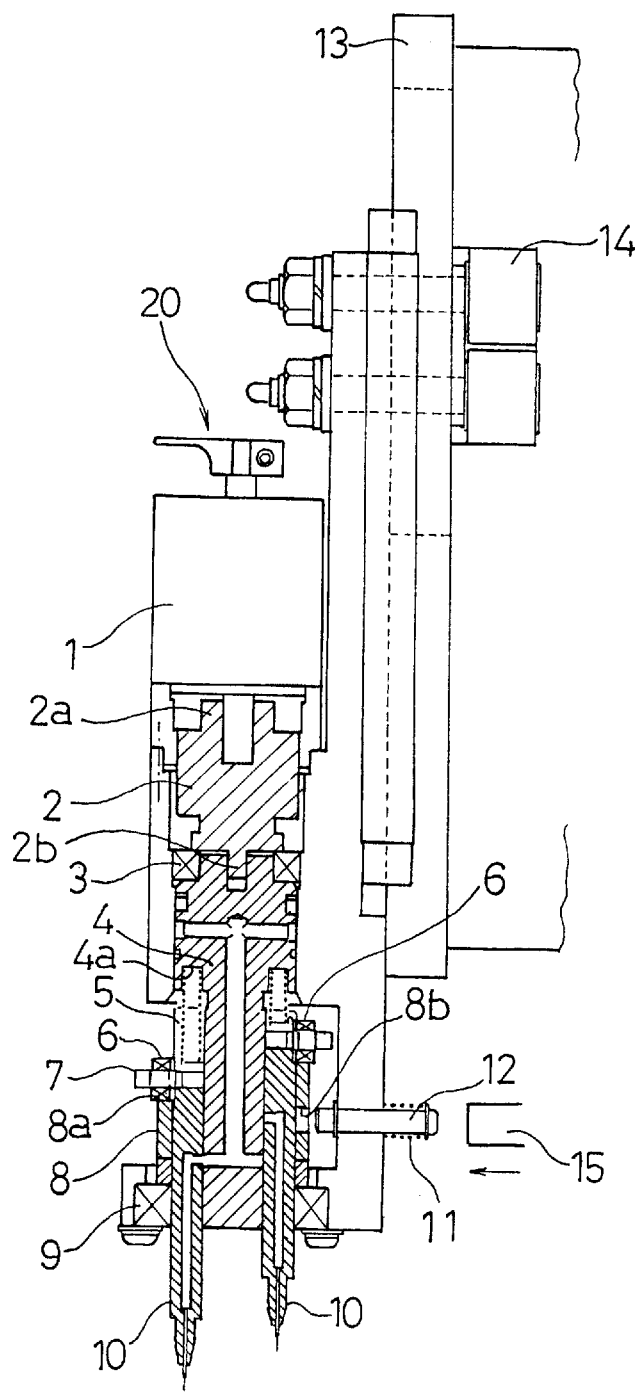
FIG. 2 is a longitudinal sectional side view of a suction nozzle section according to the same embodiment.

FIG. 1 and FIG. 2 are, respectively, a front view and a longitudinal sectional side view showing the details of the suction nozzle section 20 according to the present invention. The suction nozzle section 20 comprises a motor 1, a reduction gear 2 connected to the motor 1, a rod section 4 to which a drive force is transmitted from the motor 1 via the reduction gear 2, bearings 3, 9 for supporting the rod section 4, a plurality of nozzle tip sections 10 supported on the rod section 4 via intervening springs 5, rollers 6 and fulcrum pins 7 attached on one ends of the nozzle tip sections 10, a cylindrical cam section 8 coaxial with the rod section 4 having a cam surface 8a, a stopper section 12 and a spring 11 engaged therewith, a guide section 13, and a cam follower 14.

The guide sections 13 for supporting the suction nozzle sections 20 on the head section 21 of the electronic component mounting apparatus are attached slidably in a vertical direction, a cam follower 14 for engaging with a raising and lowering groove cam (not illustrated) being provided in a prescribed position on each guide section 13. A plurality of nozzle tip sections 10 for picking up electronic components 22 by suction and a rod section 4 for supporting these nozzle tip sections 10 in a vertically movable fashion are provided inside each suction nozzle section 20, in such a manner that they can be rotated by means of a motor 1 (described hereinafter) and bearings 3 and 9, about a vertical axis with respect to the upper face of the circuit board 17 onto which electronic components 22 are to be mounted. A cylindrical cam section 8 is provided such that it houses therein the rod section 4, coaxially with same. The cylindrical cam section 8 is formed with a cam surface 8a on the top face thereof in the form of a curved groove, with which the roller 6 at the upper end of the nozzle tip section 10 engages, so as to impart up and down motions to the nozzle tip section 10. The spring 5 is inserted between one end of the nozzle tip section 10 and a recess 4a formed at the lower end of the rod section 4, whereby the nozzle tip section 10 is pressed against the cam surface 8a via the rollers 6 and the fulcrums 7 coupled to the nozzle tip section 10. Upper and lower limits in the position of the nozzle tip sections 10 are thus determined by the groove-like cam surface 8a of the cylindrical cam section 8.

The motor 1 for causing the rod section 4 to rotate is attached to the input axle 2a of the reduction gear 2, and the rod section 4 is attached to the output axle 2b of the reduction gear 2, thereby causing the rod section 4 and cylindrical cam section 8 to rotate by means of the rotation of the motor 1. The rotation of the cylindrical cam section 8 can be halted by means of a stopper section provided on one side of the cylindrical cam section 8.

The stopper section comprises a recess 8b or a cut-out formed on the side face of the cylindrical cam section 8, and an engaging section 12 movable in the direction of the arrow in FIG. 2 by means of stopper driving means 15, in such a manner that it can engage with and disengage from the aforementioned recess 8b. When the engaging section 12 is driven forward by the stopper driving means 15, it engages with the recess 8b of the cylindrical cam section 8, whereby the rotation of the cylindrical cam section 8 is halted and only the rod section 4 rotates. In this case, of the plurality of nozzle tip sections 10 held by the rod section 4, the nozzle tip section 10 guided by the cylindrical cam section 8 such that it assumes the lowermost position is selected as the nozzle to be used.

When the stopper driving means 15 is retracted, the engaging section 12 is released from the recess 8b of the cylindrical cam section 8 by the force of a spring member 11 mounted thereon, whereby the cylindrical cam section 8 rotates with the rod section 4, so as to correct the rotational position of the selected nozzle tip section 10. In this way, the drive force of the motor 1 to rotate the rod section 4, which is normally used for correcting rotational position of a nozzle tip section, is utilized for selecting one of the plurality of the nozzle tip sections 10. Therefore, even whilst the head section 21 is rotating, it is possible to switch between the operations of registering the position of the nozzle tip section 10 in the rotational direction, and selecting a nozzle tip section 10 to be registered in position in the vertical direction. The stopper section for halting the rotation of the cylindrical cam section 8 should not be limited to such engaging section 12 capable of engaging and disengaging with respect to the recess 8b, and can be variously designed.

Figure 3:
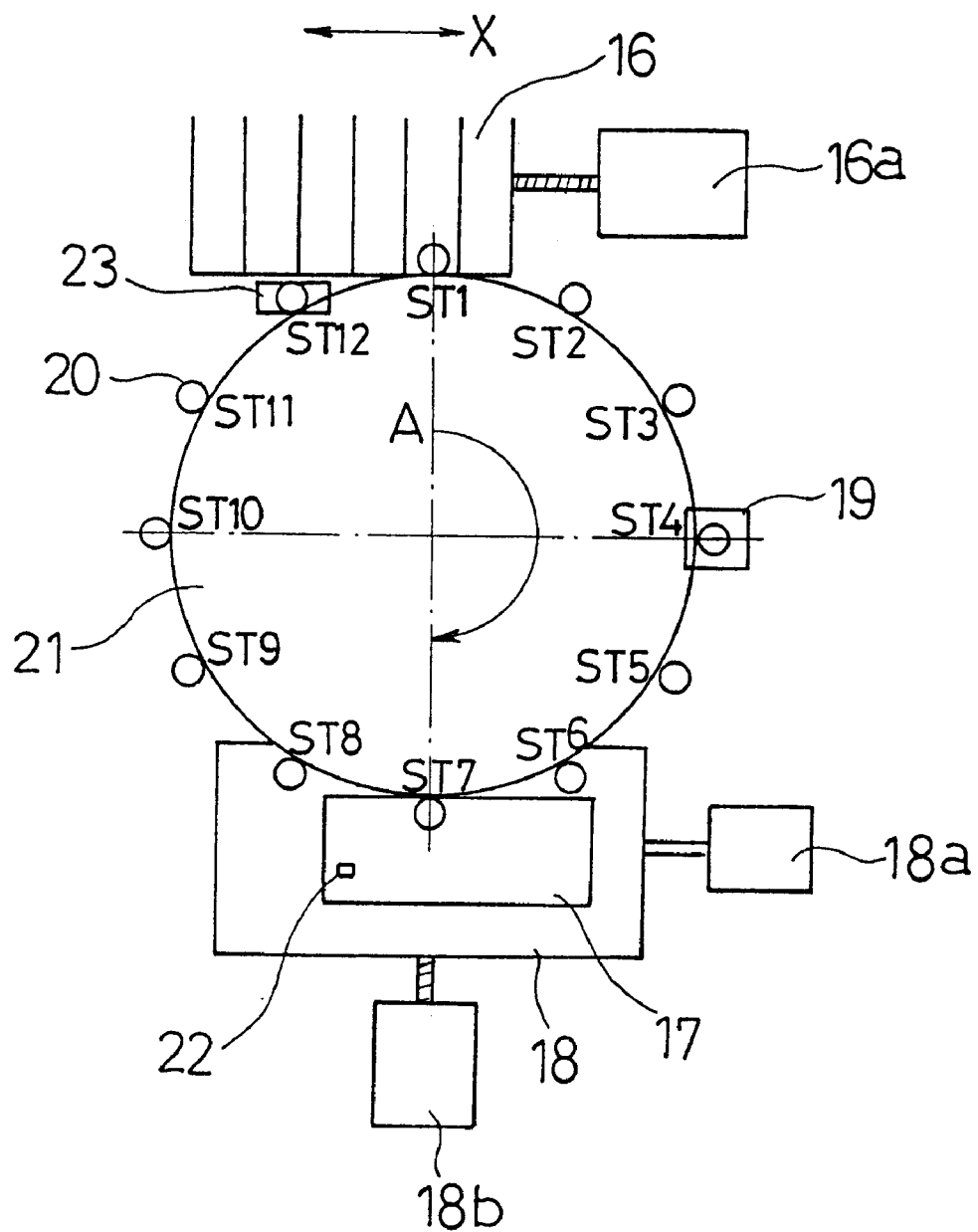
FIG. 3 is a plan view giving a general illustration of a mode of electronic component mounting operation according to the same embodiment.

As shown in FIG. 3, the head section 21 comprises twelve suction nozzle sections 20 provided at respective positions of a first station (ST1) to twelfth station (ST12) on the outer circumference thereof, and it is caused to rotate intermittently in the direction of the arrow A shown in FIG. 3.

A component supplying section 16 accommodating electronic components 22 of a plurality of different types, is driven by a driving motor 16a and moved in the X direction and registered in position, whereupon an electronic component 22 to be picked up by suction is registered in position below the suction nozzle section 20 in the position of the first station (ST1). Thereupon, the electronic component 22 is picked up by a prescribed nozzle tip section 10 in the suction nozzle section 20 at the first station (ST1) position. Next, at the second station (ST2) position, the suction nozzle section 20 that has picked up the electronic component 22 rotates the picked up electronic component 22 by driving the motor 1, to an angle for mounting on a circuit board 17 as previously determined by means of a mounting program.

At the fourth station (ST4) position, the attitude of the picked up electronic component 22 is recognized by an image recognizing section 19, and an amount of correction for the registered position of the component mounting section 18 and an amount of correction for the degree of rotation of the nozzle tip section 10 (rod section 4) are calculated from the recognized attitude of the picked up electronic component 22, by taking consideration of the predetermined mounting position and mounting angle of the electronic component 22 on the circuit board 17.

At the fifth station (ST5), corrective rotation of the suction nozzle section 20 for picking up electronic components is performed, on the basis of the respective amounts of calculation calculated above. At this time, as shown in FIG. 2, the engaging section 12 is separated from the recess 8b in the cylindrical cam section 8 by the pressing force of the spring 11, and when the motor 1 is driven, the rod section 4 holding the nozzle tip section 10 and the cylindrical cam section 8 are caused to rotate via the reduction gear 2, thereby causing the nozzle tip section 10 to rotate and be registered in position.

Next, at the seventh station (ST7) position, the suction nozzle section 20 is registered in a mounting position previously determined by a mounting program over a circuit board 17 mounted on the component mounting section 18, which has been registered in position by means of an X axis motor 18a and a Y axis motor 18b. Thereupon, at the eighth station (ST8), the suction nozzle section 20 is returned upwards by means of the cam follower 14 mentioned above. Here, the motor 1 is driven so as to cause both of the rod section 4 holding the nozzle tip section 10 and the cylindrical cam section 8 to a position where the engaging section 12 is able to engage with the recess 8b formed in the cylindrical cam section 8.

Thereupon, the head section 21 is rotated to the tenth station (ST10) position. At this time, the engaging section 12 is engaged with the recess 8b provided in the cylindrical cam section 8 by the stopper driving means 15, so that the rotation of the cylindrical cam section 8 is prevented. In this state, the motor 1 is driven, whereupon only the rod section 4 rotates, and the rollers 6 coupled to the fulcrum pins 7 of the nozzle tip sections 10 held by the rod section 4 move along the cam surface 8a of the cylindrical cam section 8. When a nozzle tip section 10 to be selected comes to a lowest position defined by the cam surface 8a, the rotation of the rod section 4 is stopped so as to position the selected nozzle tip section 10 at this lowest position. After a desired nozzle tip section 10 has been selected, the stopper driving means 15 is released from the engaging section 12, and hence the engaging section 12 is removed from the recess 8b provided in the cylindrical cam section 8 by the force of the spring 11. At the twelfth station (ST12) position, the shape of the nozzle tip section 10 is detected by the nozzle recognition section 23, and it is determined whether or not a prescribed nozzle tip section 10 has been selected. The series of operations described above is performed repeatedly.

According to the electronic component mounting apparatus of the present invention, whilst performing the operations of picking up electronic components by suction from the component supply by means of the suction nozzle sections provided about the outer circumference of the head section, and mounting the aforementioned electronic components on a mounting object, such as a circuit board, or the like, by causing the head section to rotate, it is possible to select a nozzle tip section of a suction nozzle section without halting the head section, and therefore high-speed operation of electronic component mounting processes can be achieved, and furthermore, by adopting a cylindrical cam function, the load on the suction nozzle sections is reduced, thereby allowing durability to be improved.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. An electronic component mounting apparatus comprising:
a component supplying section for supplying electronic components;
a component mounting section for mounting electronic components onto a mounting object;
a plurality of suction nozzle sections for picking up electronic components by suction and mounting the electronic components onto the mounting object; and
a head section provided with a plurality of suction nozzle sections disposed about an outer edge thereof, the operation of picking up and mounting said electronic components being performed by said suction nozzle sections at prescribed halt positions by said head section being rotated intermittently;
wherein each of said suction nozzle sections comprises:
a plurality of nozzle tip sections,
a rod section for holding said nozzle tip sections so as to allow each of the nozzle tip sections to move upward and downward, said nozzle tip sections being disposed about an outer edge of the rod section,
a motor section connected to the rod section for causing said rod section to rotate about a central axis of the suction nozzle section,
a cylindrical cam section concentric with the rod section so as to be rotatable selectively together with and relative to the rod section, said cylindrical cam section having a cam surface that controls height positions of the nozzle tip sections when the cylindrical cam section is rotated with respect to the rod section, and
a stopper section provided on an outer side of the cylindrical cam section for selectively halting the rotation of the cylindrical cam section while permitting the rod section to rotate relative to the cylindrical cam section thus causing said rod section to change height of the nozzle tip sections.

2. The electronic component mounting apparatus according to claim 1, wherein said cam surface of the cylindrical cam section is a curved surface formed to an upper edge of the cylindrical cam section such as to guide the nozzle tip sections successively to a lower limit position of the upward and downward movements of the nozzle tip sections.

3. The electronic component mounting apparatus according to claim 1, wherein the stopper section comprises a recess formed in a side face of the cylindrical cam section and an engaging section disposed for selective engagement and disengagement with and from said recess in the side face of the cylindrical cam section.

4. A method for mounting electronic components in an electronic component mounting apparatus having a component supplying section for supplying electronic components, a head section movably mounted on a rotating table, a plurality of suction nozzle sections that are movable with and with respect to the head section, each suction nozzle section comprising a plurality of nozzle tip sections disposed around a rod section so as to be movable upwards and downwards, a motor section for driving the rod section to rotate about the central axis of the suction nozzle section, a cylindrical cam section concentric with the rod section so as to be rotatable selectively relative to and together with the rod section, the cylindrical cam section having a cam surface that controls height positions of the nozzle tip sections and a recess in a side face of the cylindrical cam section, and a stopper section provided on a side of the cylindrical cam section having an engaging section to selectively engage with said recess in the cylindrical cam section, the method comprising:
causing the engaging section of the stopper section to engage with the recess in the cylindrical cam section, whereby the rotation of the cylindrical cam section is stopped and the rod section rotates in response to a motive force of the motor section;
rotating the rod section while movement of the cylindrical cam section is stopped, so that a nozzle tip section to be selected is guided to a lower limit position of the upward and downward movements of the nozzle tip sections by the cylindrical cam section;
releasing the engaging section of the stopper section from the recess in the cylindrical cam section to cause the nozzle tip section that has been selected to remain at the lower limit position; and
rotating the rod section and the cylindrical cam section of the suction nozzle section together to enable control of the rotational position of the selected nozzle tip section.

5. The electronic component mounting apparatus according to claim 1, said motor being mounted coaxially with said rod section.

6. An electronic component mounting apparatus comprising:
a plurality of suction nozzle sections that pick up electronic components by suction and mount the electronic components onto an object; and
a head section provided with a plurality of suction nozzle sections disposed about the outer edge of said head section, picking up and mounting of said electronic components being performed by said suction nozzle sections at predetermined stop positions of said head section, said head section being intermittently rotated between said predetermined stop positions;
each of said suction nozzle sections comprising:
a plurality of nozzle tip sections;
a rod section that holds said nozzle tip sections so as to allow each of the nozzle tip sections to move upwardly and downwardly, said nozzle tip sections being disposed about an outer edge of the rod section;
a motor section connected to the rod section, said motor driving said rod section to rotate about a central axis of the suction nozzle section;
a cylindrical cam section concentric with the rod section and rotatable relative to the rod section, said cylindrical cam section having a cam surface configured to move each of said nozzle tip sections upwardly and downwardly; and
a stopper section provided adjacent to a side surface of the cylindrical cam section, said stopper section configured to selectively engage said cylindrical cam section to stop rotation of the cylindrical cam section while permitting the rod section to rotate relative to the cylindrical cam section, a motive force of the motor being selectively transmitted to rotate said nozzle tip sections about the central axis and to translate said nozzle tip sections parallel to the central axis in association with disengagement and engagement of said stopper section with said cylindrical cam section.

* * * * *

UNITED STATES PATENT AND TRADEMARK OFFICE
CERTIFICATE OF CORRECTION

PATENT NO. : 6,553,659 B1  Page 1 of 1
DATED : April 29, 2003
INVENTOR(S) : A. Ida et al.

It is certified that error appears in the above-identified patent and that said Letters Patent is hereby corrected as shown below:

<u>Title page,</u>
Item [57], ABSTRACT,
Line 8, "8having" should be -- 8 having --.

Signed and Sealed this

Twenty-fifth Day of November, 2003

JAMES E. ROGAN
*Director of the United States Patent and Trademark Office*